(12) United States Patent
Wu et al.

(10) Patent No.: US 12,100,606 B2
(45) Date of Patent: Sep. 24, 2024

(54) WAFER TRANSFER DEVICE AND WAFER TRANSFER METHOD

(71) Applicant: SHENYANG KINGSEMI Co., Ltd., Shenyang (CN)

(72) Inventors: Tianyao Wu, Shenyang (CN); Hao Wang, Shenyang (CN); Xinglong Chen, Shenyang (CN); Tao Miao, Shenyang (CN)

(73) Assignee: SHENYANG KINGSEMI Co., Ltd., Shenyang (CN)

( * ) Notice: Subject to any disclaimer, the term of this patent is extended or adjusted under 35 U.S.C. 154(b) by 91 days.

(21) Appl. No.: 17/636,208

(22) PCT Filed: Sep. 24, 2021

(86) PCT No.: PCT/CN2021/120095
§ 371 (c)(1),
(2) Date: Feb. 17, 2022

(87) PCT Pub. No.: WO2023/024207
PCT Pub. Date: Mar. 2, 2023

(65) Prior Publication Data
US 2023/0343623 A1    Oct. 26, 2023

(30) Foreign Application Priority Data

Aug. 27, 2021 (CN) .................. 202110997889.5

(51) Int. Cl.
*H01L 21/677* (2006.01)
*H01L 21/683* (2006.01)
*H01L 21/687* (2006.01)

(52) U.S. Cl.
CPC .. *H01L 21/67706* (2013.01); *H01L 21/67712* (2013.01); *H01L 21/6838* (2013.01); *H01L 21/68707* (2013.01)

(58) Field of Classification Search
CPC ......... H01L 21/67706; H01L 21/67742; H01L 21/68707; H01L 21/67766; B25J 9/043
See application file for complete search history.

(56) References Cited

U.S. PATENT DOCUMENTS

| | | |
|---|---|---|
| 5,083,896 A | 1/1992 | Uehara et al. |
| 9,252,034 B2 | 2/2016 | Lee et al. |

(Continued)

FOREIGN PATENT DOCUMENTS

| | | |
|---|---|---|
| CN | 102282664 A | 12/2011 |
| CN | 102326244 A | 1/2012 |

(Continued)

OTHER PUBLICATIONS

China National Intellectual Property Administration, First review notice book, application No. 202110997889.5, mailed Jul. 1, 2023, 6 pages.

(Continued)

*Primary Examiner* — Gerald McClain
(74) *Attorney, Agent, or Firm* — Ziegler IP Law Group LLC.

(57) ABSTRACT

The wafer transfer device includes a first supporting mechanism, a second supporting mechanism, a first picking-conveying mechanism and a second picking-conveying mechanism, wherein the first picking-conveying mechanism and the second picking-conveying mechanism include tail end execution parts facing opposite directions. The wafer transfer device further includes a rotating mechanism and a rotating driving part, wherein the first supporting mechanism and the second supporting mechanism are fixedly arranged at the rotating mechanism, and the rotating driving part drives the rotating mechanism to rotate and then drives the first supporting mechanism and the second supporting mechanism to rotate synchronously. The wafer transfer (Continued)

device can extend the picking and conveying range of a wafer, thus facilitating the improvement of the productivity.

3 Claims, 3 Drawing Sheets

(56) References Cited

U.S. PATENT DOCUMENTS

| | | | |
|---|---|---|---|
| 2002/0048502 | A1 | 4/2002 | Minami et al. |
| 2009/0082895 | A1 | 3/2009 | Barker et al. |
| 2013/0183131 | A1 | 7/2013 | Blank et al. |
| 2020/0126823 | A1* | 4/2020 | Teramoto ............ H01L 21/6773 |
| 2022/0334484 | A1* | 10/2022 | Hong ................ H01L 21/67178 |

FOREIGN PATENT DOCUMENTS

| | | |
|---|---|---|
| CN | 103476551 A | 12/2013 |
| CN | 102763210 B | 8/2015 |
| CN | 108091602 A | 5/2018 |
| CN | 108573906 A | 9/2018 |
| CN | 106373907 A | 1/2019 |
| CN | 112582318 A | 3/2021 |
| CN | 112885730 A | 6/2021 |
| KR | 20090131509 A | 12/2009 |
| TW | 201517200 A | 11/2018 |

OTHER PUBLICATIONS

China National Intellectual Property Administration, International Search Report, Application No. PCT/CN2021/120095, mailed May 26, 2022, 8 pages.

Taiwan Patent Office, Search Report, Application No. 110135662, mailed Jan. 10, 2023, 1 page.

* cited by examiner

WAFER TRANSFER DEVICE AND WAFER TRANSFER METHOD

CROSS-REFERENCE TO RELATED APPLICATIONS

This invention claims the priority of Chinese Patent Application No. 2021109978895 filed on Aug. 27, 2021, the entire disclosure of which is incorporated herein by reference.

FIELD OF TECHNOLOGY

The present invention relates to the field of semiconductor processing, and in particular relates to a wafer transfer device and a wafer transfer method.

BACKGROUND

A wafer transfer device, which makes a wafer be transited among all stations, is a core moving part in semiconductor processing equipment; with rapid development of the semiconductor industry, a wafer transfer technology has gradually become a key factor restricting industry development, and the performance thereof directly affects the production efficiency and manufacturing quality of the wafer. Meanwhile, with the increasing production capacity of a lithography machine, the transfer capacity of the wafer transfer device in gluing and developing equipment docked to the lithography machine needs to be continuously improved.

In the Chinese patent with publication number of CN102763210B, a system capable of achieving bidirectional transfer is provided. Two sliding forks for picking and conveying of the system are mutually fixed and are arranged on the same fork frame together; the two sliding forks are arranged in opposite directions and always face the opposite directions, and the picking-conveying range of a wafer is limited due to the fact that an included angle between the sliding forks cannot be adjusted.

Therefore, it is necessary to develop a novel wafer transfer device to avoid above problems in the prior art.

SUMMARY

A first objective of the present disclosure is to provide a wafer transfer device, which can extend the picking and conveying range of a wafer, thus facilitating the improvement of the productivity.

To achieve the objective, the wafer transfer device provided by the present invention comprises a first supporting mechanism and a second supporting mechanism, wherein the first supporting mechanism and the second supporting mechanisms are arranged side by side along a translation direction, two opposite outer side walls of the first supporting mechanism and the second supporting mechanism are each provided with a picking-conveying guide structure; the wafer transfer device further comprises a first picking-conveying mechanism and a second picking-conveying mechanism movably arranged at the picking-conveying guide structure of the first supporting mechanism and the picking-conveying guide structure of the second supporting mechanism respectively; wherein the first picking-conveying mechanism and the second picking-conveying mechanism each comprise a tail end execution part, the tail end execution part of the first picking-conveying mechanism and the tail end execution part of the second picking-conveying mechanism are oppositely arranged along a lifting direction and face opposite directions, and the lifting direction is perpendicular to the translation direction; the wafer transfer device further comprises a picking-conveying driving part connected to the first picking-conveying mechanism and the second picking-conveying mechanism to drive the first picking-conveying mechanism to move along an arrangement direction of the picking-conveying guide structure of the first supporting mechanism and to drive the second picking-conveying mechanism to move along an arrangement direction of the picking-conveying guide structure of the second supporting mechanism; the wafer transfer device further comprises a rotating mechanism and a rotating driving part, wherein the first supporting mechanism and the second supporting mechanism are fixedly arranged at the rotating mechanism, the rotating mechanism is rotatably arranged at the rotating driving part, the rotating driving part drives the rotating mechanism to rotate, and then drives at least one of the first supporting mechanism and the second supporting mechanism to rotate synchronously, thus changing a movement direction of at least one of the first picking-conveying mechanism and the second picking-conveying mechanism.

The transfer device provided by the present invention has beneficial effects that the first picking-conveying mechanism and the second picking-conveying mechanism are movably arranged at the picking-conveying guide structure of the first supporting mechanism and the picking-conveying guide structure of the second supporting mechanism respectively; the first picking-conveying mechanism and the second picking-conveying mechanism each comprise a tail end execution part, the tail end execution part of the first picking-conveying mechanism and the tail end execution part of the second picking-conveying mechanism are oppositely arranged along a lifting direction and face opposite directions; the rotating mechanism is rotatably arranged at the rotating driving part, the rotating driving part drives the rotating mechanism to rotate, and then drives at least one of the first supporting mechanism and the second supporting mechanism to rotate synchronously, thus changing the movement direction of at least one of the first picking-conveying mechanism and the second picking-conveying mechanism; the transfer device can extend the picking and conveying range of a wafer, thus facilitating the improvement of the productivity.

Preferably, the wafer transfer device further comprises a translation adjusting mechanism and a translation adjusting driving part, the translation adjusting mechanism is movably arranged at the translation adjusting driving part along the translation direction; the rotating driving part is fixedly arranged at the translation adjusting mechanism, the translation adjusting driving part drives the translation adjusting mechanism to move along the translation direction, and then drives the rotating driving part and the rotating mechanism to move along the translation direction, thus making at least one of the first supporting mechanism and the second supporting mechanism move along the translation direction. The beneficial effect thereof is that movement of the supporting mechanism in the translation direction towards a picking-conveying position corresponding to a target wafer is achieved.

Further preferably, the wafer transfer device further comprises a lifting mechanism and a lifting driving part, the lifting mechanism is movably arranged at the lifting driving part along the lifting direction; the translation adjusting driving part is fixedly arranged at the lifting mechanism, the lifting driving part drives the lifting mechanism to move along the lifting direction, and then drives the translation adjusting driving part and the translation adjusting mechanism to move along the lifting direction, thus making at least one of the first supporting mechanism and the second supporting mechanism move along the lifting direction. The beneficial effect is that movement of the supporting mechanism in the lifting direction towards the picking-conveying position corresponding to the target wafer is achieved.

Preferably, the rotating mechanism comprises two sub rotating mechanisms, the rotating driving part comprises two sub rotating driving parts, the two sub rotating mechanisms are respectively rotatably arranged at the two sub rotating driving parts, thus making the two sub rotating mechanisms rotate respectively under the driving of the two sub rotating driving parts.

Further preferably, the first supporting mechanism and the second supporting mechanism are respectively fixedly arranged at the two sub rotating mechanisms to respectively control the first supporting mechanism and the second supporting mechanism to rotate under the driving of the two sub rotating driving parts. The beneficial effect thereof is that separate rotation of the first supporting mechanism and the second supporting mechanism is achieved.

Preferably, the translation adjusting mechanism comprises two sub translation adjusting mechanisms, the translation adjusting driving part comprises two sub translation adjusting driving parts, the two sub translation adjusting mechanisms are respectively movably arranged at the two sub translation adjusting driving parts along the translation direction, thus making the two sub translation adjusting mechanisms move respectively along the translation direction under the driving of the two sub translation adjusting driving parts.

Further preferably, the two sub rotating driving parts are respectively fixedly arranged at the two sub translation adjusting mechanisms to respectively control the two sub rotating mechanisms to move along the translation direction under the driving of the two sub translation adjusting driving parts, thus driving the first supporting mechanism and the second supporting mechanisms to move along the translation direction respectively. The beneficial effect thereof is that movement of the first supporting mechanism and the second supporting mechanism along the translational direction respectively is achieved.

Preferably, the lifting mechanism comprises two sub lifting mechanisms, the lifting driving part comprises two sub lifting driving parts, the two sub lifting mechanisms are movably arranged at the two sub lifting driving parts along the lifting direction respectively, thus making the two sub lifting mechanisms move along the lifting direction respectively under the driving of the two sub lifting driving parts.

Further preferably, the two sub translation adjusting driving parts are respectively fixedly arranged at the two sub lifting mechanisms to respectively control the two sub translation adjusting mechanisms to move along the lifting direction respectively under the driving of the two sub lifting driving parts, thus driving the first supporting mechanism and the second supporting mechanisms to move along the lifting direction respectively. The beneficial effect thereof is that movement of the first supporting mechanism and the second supporting mechanism along the lifting direction respectively is achieved.

A second objective of the present invention is to provide a wafer transfer method, which can extend the pick-conveying range of a wafer, thus facilitating the improvement of the productivity.

To achieve the objective, the wafer transfer method provided by the present invention comprises driving, by the rotating driving part, the rotating mechanism to rotate, and then driving at least one of the first supporting mechanism and the second supporting mechanism to rotate synchronously, thus making the first picking-conveying mechanism and the second picking-conveying mechanism face a wafer picking position or a wafer placement position; driving the first picking-conveying mechanism and the second picking-conveying mechanism by a picking-conveying driving part, thus making the first picking-conveying mechanism and the second picking-conveying mechanism stretch out along arrangement directions of the picking-conveying guide structures, and making the tail end execution part of the first picking-conveying mechanism and the tail end execution part of the second picking-conveying mechanism achieve the action of gripping or placement, and retracting after completing the action.

DESCRIPTION OF THE EMBODIMENTS

To make objectives, technical solutions, and advantages of embodiments of the present invention more clearly, the technical solutions in the embodiments of the present invention will be clearly and completely described below. Apparently, described embodiments are a part rather than all embodiments of the present invention. Based on the embodiments of the present invention, all the other embodiments obtained by those of ordinary skill in the art without creative efforts are within the scope of the present invention. Unless otherwise mentioned, all technical and scientific terms used herein have the same meaning as commonly understood by one of ordinary skill in the art to which the present invention belong. As used herein, words such as "comprising" and the like mean that elements or items appearing before the word encompass elements or items listed after the word and equivalents thereof, without excluding other elements or items.

To solve the problem in the prior art, an embodiment of the present invention provides a wafer transfer device.

Figure 1:
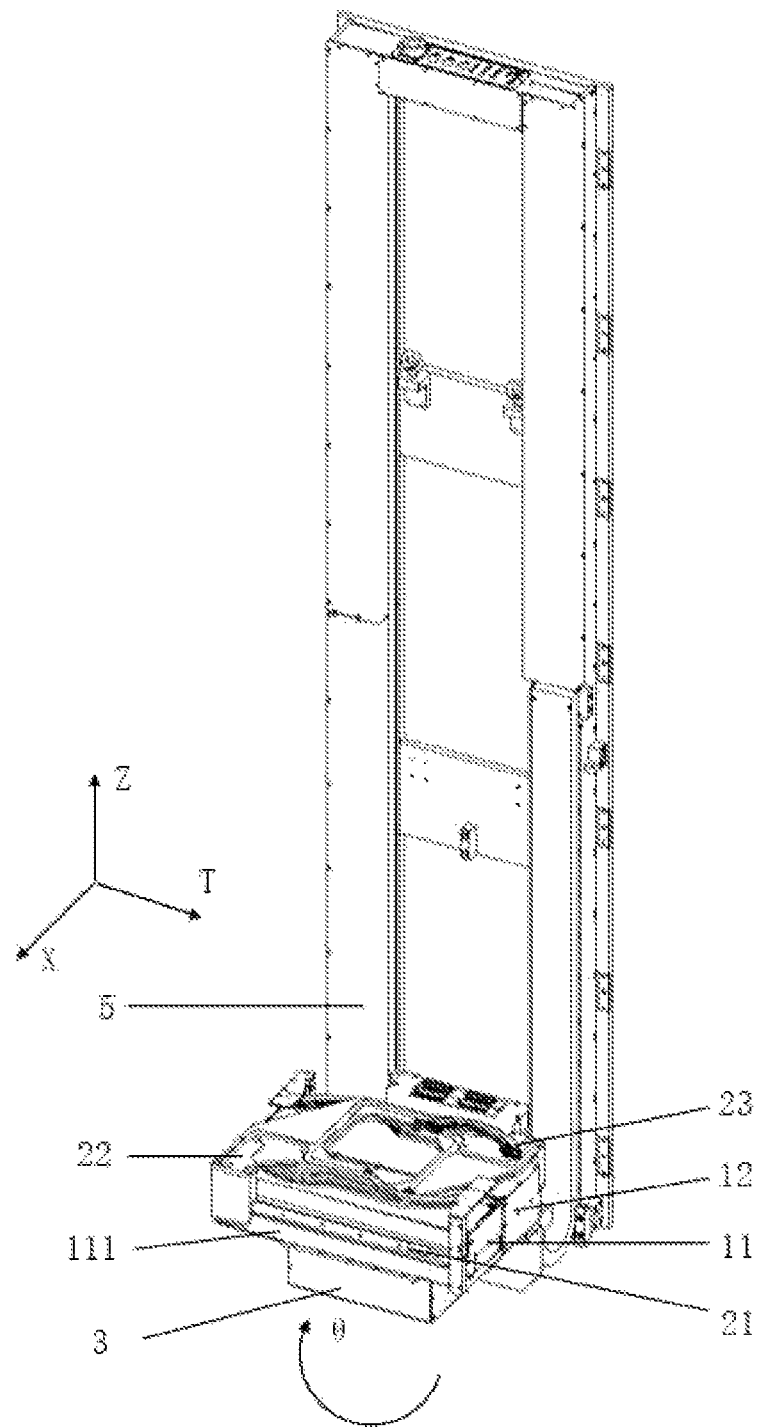
FIG. 1 is a structure diagram of a wafer transfer device in accordance with one embodiment of the present invention.
Figure 2:
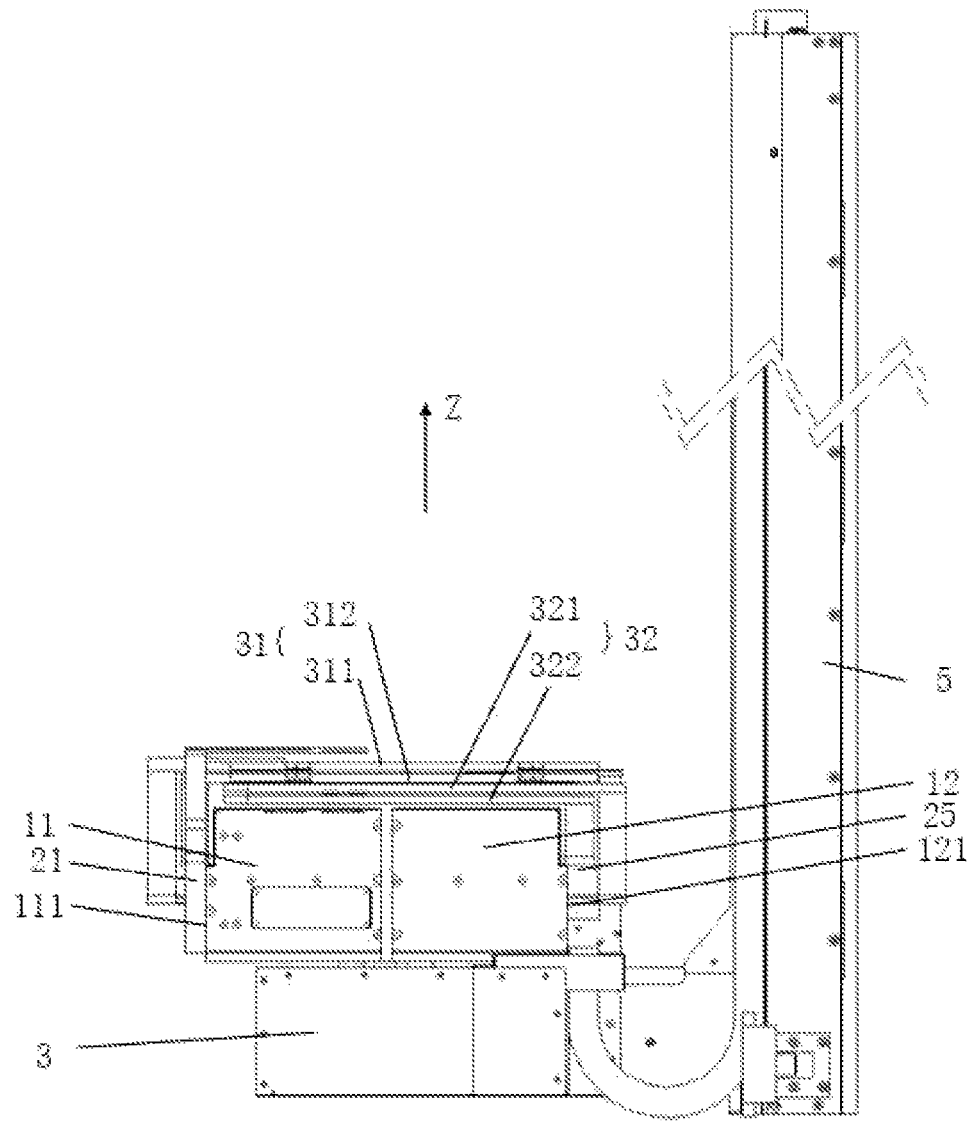
FIG. 2 is a structure diagram of a partial structure of the wafer transfer device shown in FIG. 1 along an opposite direction of T axis.
Figure 3:
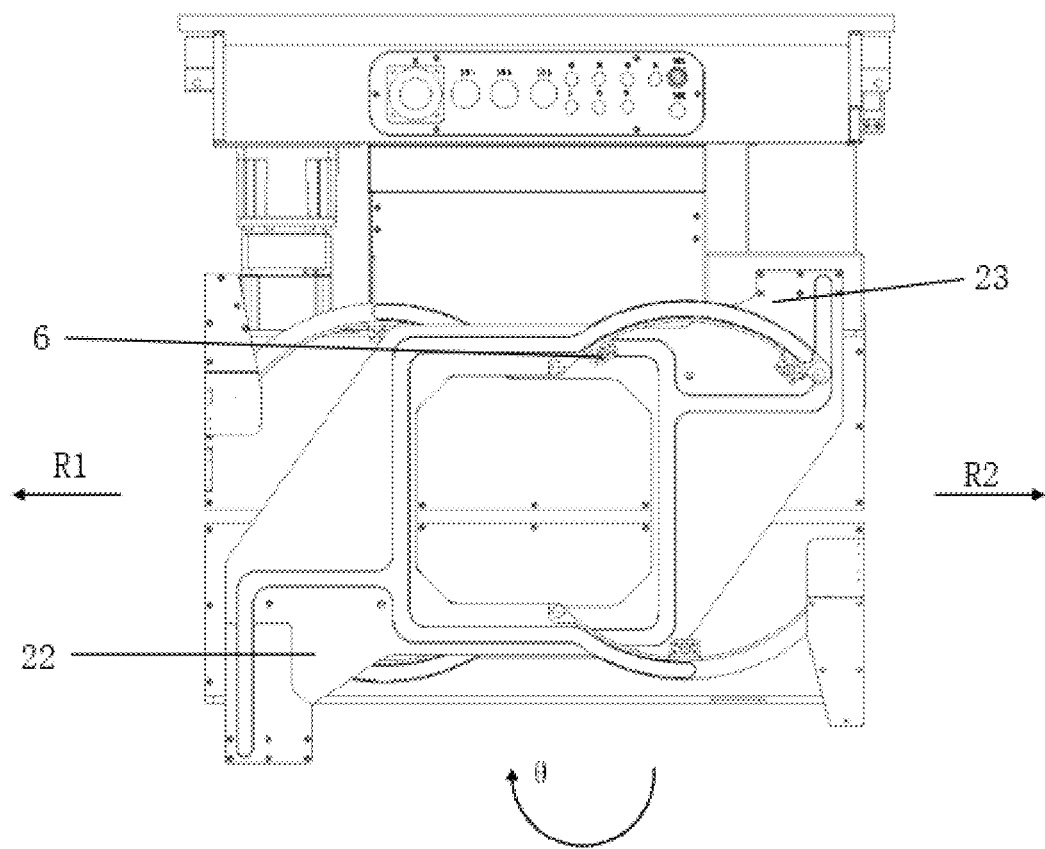
FIG. 3 is a vertical view of the wafer transfer device shown in FIG. 1.

FIG. 1 is a structure diagram of a wafer transfer device in accordance with one embodiment of the present invention; FIG. 2 is a structure diagram of a partial structure of the wafer transfer device shown in FIG. 1 along an opposite direction of T axis; and FIG. 3 is a vertical view of the wafer transfer device shown in FIG. 1.

In the embodiment of the present invention, the wafer transfer device comprises a first supporting mechanism and a second supporting mechanism, the first supporting mechanism and the second supporting mechanism are arranged side by side along a translation direction, and two opposite outer side walls of the first supporting mechanism and the second supporting mechanism are each provided with a picking-conveying guide structure.

Specifically, referring to FIG. 1 and FIG. 2, the first supporting mechanism 11 and the second supporting mechanism 12 are arranged side by side (which is interpreted to mean the wafer transfer device occupies a folded space) along the translation direction, i.e., a X direction or an opposite direction thereof; the interior of the first supporting mechanism 11 and the interior of the second supporting mechanism 12 are of hollow structures in which components such as motors, communication cables, and the like are placed; a side wall surface 111 of the first supporting mechanism 11 and a side wall surface 121 of the second supporting mechanism are respectively provided with a first picking-conveying guide structure 21 and a second picking-conveying guide structure 25, the first picking-conveying guide structure 21 and the second picking-conveying guide structure 25 are respectively arranged on two opposite side wall surfaces of the first supporting mechanism 11 and the second supporting mechanism 12 in a way that opening directions are opposite, and each picking-conveying guide structure comprises a guide rail.

In the embodiment of the present invention, the wafer transfer device comprises a first picking-conveying mechanism and a second picking-conveying mechanism; the first picking-conveying mechanism and the second picking-conveying mechanism are respectively movably arranged at the picking-conveying guide structure of the first supporting mechanism and the picking-conveying guide structure of the second supporting mechanism; the first picking-conveying mechanism and the second picking-conveying mechanism each comprise a tail end execution part, the tail end execution part of the first picking-conveying mechanism and the tail end execution part of the second picking-conveying mechanism are oppositely arranged along the lifting direction and face opposite directions, and the lifting direction is perpendicular to the translation direction.

Specifically, referring to FIG. 2 and FIG. 3, the first picking-conveying mechanism 22 comprises a first tail end execution part 31, the second picking-conveying mechanism 23 comprises a second tail end execution part 32; taking the first tail end execution part 31 as an example, a front end of the first tail end execution part 31 is composed of two opposite arc structures (not shown in figure) and is used for bearing a wafer; a vacuum suction head 6 is arranged at a position, close to a free end, of each arc structure, and is used for adsorbing and fixing the wafer.

More specifically, each arc structure is provided with a hollow structure communicated with the vacuum suction head 6, and is connected to an air extracting device to provide negative pressure. A specific implementation mode of the vacuum suction head 6 in the first picking-conveying mechanism 22 and the second picking-conveying mechanism 23 is the conventional technical means of those skilled in the art.

Referring to FIG. 2 and FIG. 3, the first tail end execution part 31 and the second tail end execution part 32 are oppositely arranged along a lifting direction, i.e., a Z direction shown in the figure or an opposite direction thereof (both of which are interpreted as a third axis direction), and a gap is formed between the first tail end execution part and the second tail end execution part to prevent collision in various movement processes. The arc structures at the front ends of the first tail end execution part 31 and the second tail end execution part 32 face opposite directions, the first tail end execution part 31 faces a R1 direction shown in the figure, and the second tail end execution part 32 faces a R2 direction shown in the figure.

The lifting direction is perpendicular to the translation direction, referring to FIG. 1, the Z direction shown in the figure is perpendicular to a T direction shown in the figure.

In the embodiment of the present invention, the wafer transfer device comprises a picking-conveying driving part, the picking-conveying driving part is connected to the first picking-conveying mechanism and the second picking-conveying mechanism to drive the first picking-conveying mechanism to move along an arrangement direction of the picking-conveying guide structure of the first supporting mechanism and to drive the second picking-conveying mechanism to move along an arrangement direction of the picking-conveying guide structure of the second supporting mechanism.

In some specific embodiments, the first supporting mechanism 11 and the second supporting mechanism 12 are both hollow cavities, the number of the picking-conveying driving part is two, and the two picking-conveying driving parts are respectively arranged in the hollow cavities.

In some specific embodiments, the picking-conveying driving parts are arranged at externals of the first supporting mechanism 11 and the second supporting mechanism 12, and are respectively connected to the first supporting mechanism 11 and the second supporting mechanism 12 to achieve driving control for the first supporting mechanism 11 and the second supporting mechanism 12.

In some specific embodiments, the picking-conveying driving parts comprise two sets of driving mechanisms for respectively controlling the first picking-conveying mechanism and the second picking-conveying mechanism; each driving mechanism comprises a motor, a lead screw, and a lead screw nut seat; the two sets of driving mechanisms are arranged in opposite directions; the motor drives the lead screw to rotate, the lead screw nut seat is mounted on the lead screw to move as the lead screw rotates; the lead screw nut seat is connected to a corresponding picking-conveying mechanism and drives the picking-conveying mechanism to move.

Under the driving of the picking-conveying driving part, referring to FIG. 3, taking the first picking-conveying mechanism 22 as an example, the first picking-conveying mechanism 22 stretches out or retracts along an arrangement direction of the first picking-conveying guide structure 21, i.e., the R1 direction shown in the figure or an opposite direction thereof.

Under one control, the two motors of the picking-conveying driving parts receive electric signals with the same content and rotate, and the two lead screw nut seats move in opposite directions at the same time to drive the first picking-conveying mechanism 22 and the second picking-conveying mechanism 23 to synchronously stretch out or retract along opposite directions to complete the picking-conveying action.

Under another control, any one of the two motors of the picking-conveying driving parts receives an electric signal and rotates, and the lead screw nut seat corresponding to the motor moves to drive the picking-conveying mechanism corresponding to the motor to stretch out or retract along the picking-conveying direction to complete the picking-conveying action; and the other picking-conveying mechanism does not perform the picking-conveying action.

In the embodiment of the present invention, the wafer transfer device comprises a rotating mechanism and a rotating driving part, the first supporting mechanism and the second supporting mechanism are fixedly arranged at the rotating mechanism, the rotating mechanism is rotatably arranged at the rotating driving part, the rotating driving part drives the rotating mechanism to rotate, and then drives at least one of the first supporting mechanism and the second supporting mechanism to rotate synchronously, thus changing a movement direction of at least one of the first picking-conveying mechanism and the second picking-conveying mechanism.

Specifically, in some embodiments, the first supporting mechanism 11 and the second supporting mechanism 12 are fixedly connected to the rotating mechanism, the rotating driving part comprises a motor and a connector, the motor is connected to the rotating mechanism through the connector to drive the rotating mechanism to rotate along a θ direction shown in FIG. 1 or an opposite direction thereof, and then to drive one or two in the first supporting mechanism 11 and the second supporting mechanism 12 to rotate synchronously (which is interpreted to mean the wafer transfer device occupies unfolded spaces); the rotating mechanism and the rotating driving part are installed in an accommodating cavity 3.

In some embodiments, the motor included in the rotating driving part is a stepping motor.

In the embodiment of the present invention, the wafer transfer device comprises a translation adjusting mechanism (which is interpreted as a second-axis-direction adjusting mechanism) and a translation adjusting driving part, the translation adjusting mechanism is movably arranged at the translation adjusting driving part along the translation direction; the rotating driving part is fixedly arranged at the translation adjusting mechanism, the translation adjusting driving part drives the translation adjusting mechanism to move along the translation direction, and then drives the rotating driving part and the rotating mechanism to move along the translation direction, thus making at least one of the first supporting mechanism and the second supporting mechanism move along the translation direction (which is interpreted to mean the wafer transfer device occupies unfolded spaces).

Specifically, in some embodiments, the translation adjusting driving part comprises a translation guide rail and a linear motor, the linear motor is arranged in the linear guide rail, the linear motor is fixedly connected to the translation adjusting mechanism, the translation adjusting mechanism is fixedly connected to the rotating driving part, the linear motor drives the translation adjusting mechanism, and then drives the rotating driving part to move along the translation direction, i.e., move along a T direction shown in FIG. 1 or an opposite direction thereof (both of which are interpreted as a second axis direction), thus making the first supporting mechanism 11 and the second supporting mechanism 12 move along the translation direction, i.e., move along the T direction shown in the figure or the opposite direction thereof.

In the embodiment of the present invention, the wafer transfer device comprises a lifting mechanism (which is interpreted as a third-axis-direction lifting mechanism) and a lifting driving part, the lifting mechanism is movably arranged at the lifting driving part along the lifting direction; the translation adjusting driving part is fixedly arranged at the lifting mechanism, the lifting driving part drives the lifting mechanism to move along the lifting direction, and then drives the translation adjusting driving part and the translation adjusting mechanism to move along the lifting direction, thus making at least one of the first supporting mechanism and the second supporting mechanism move along the lifting direction.

Specifically, the lifting driving part comprises a lifting guide rail 5 shown in FIG. 1, and a linear motor; the linear motor is fixedly connected to the lifting mechanism; the translation adjusting driving part is fixedly connected to the lifting mechanism, the linear motor drives the translation adjusting driving part to move along the lifting direction by driving the lifting mechanism, i.e., move along a Z direction shown in FIG. 1 or an opposite direction thereof, thus making the first supporting mechanism 11 and the second supporting mechanism 12 move along the lifting direction, i.e., move along the Z direction shown in FIG. 1 or the opposite direction thereof.

Figure 4:
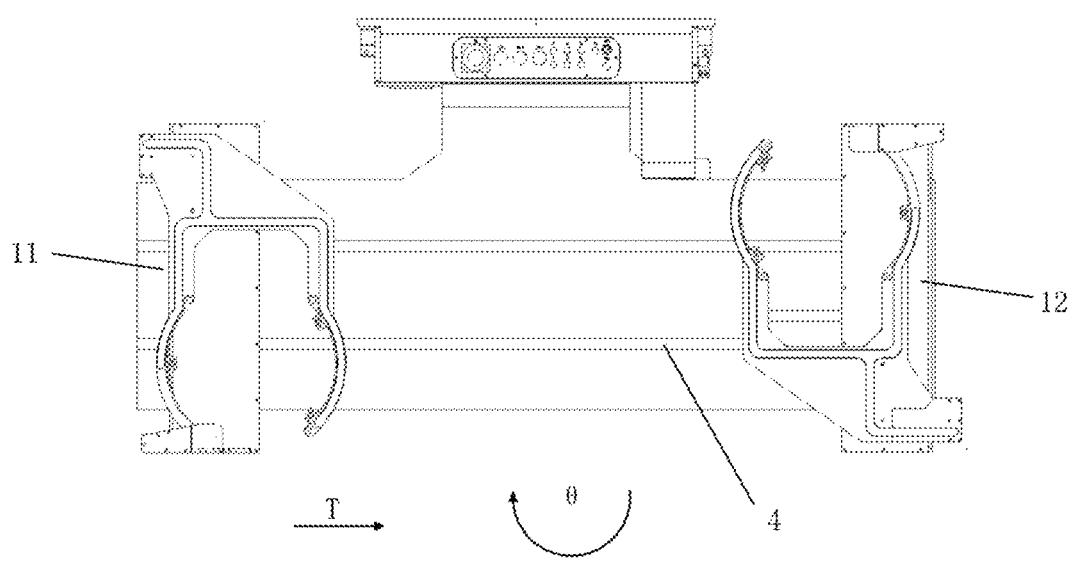
FIG. 4 is a vertical view of a wafer transfer device in accordance with another embodiment of the present invention.

FIG. 4 is a vertical view of a wafer transfer device in accordance with another embodiment of the present invention.

In the embodiment of the present invention, the rotating mechanism comprises two sub rotating mechanisms, the rotating driving part comprises two sub rotating driving parts, the two sub rotating mechanisms are respectively rotatably arranged at the two sub rotating driving parts, thus making the two sub rotating mechanisms rotate respectively under the driving of the two sub rotating driving parts.

Specifically, any one of the two sub rotating driving parts comprises a motor and a connector; by taking one sub rotating driving part and one sub rotating mechanism as an example, the motor is fixedly connected to the sub rotating mechanism through the connector to drive the sub rotating mechanism to rotate along a θ direction shown in figure or an opposite direction thereof, and the two sub rotating mechanisms and the two sub rotating driving parts are installed in the accommodating cavity 3 shown in FIG. 1.

In the embodiment of the present invention, the first supporting mechanism and the second supporting mechanism are respectively fixedly arranged at the two sub rotating mechanisms to respectively control rotation movements of the first supporting mechanism and the second supporting mechanism under the driving of the two sub rotating driving parts.

Specifically, referring to FIG. 4, the first supporting mechanism 11 and the second supporting mechanisms 12 are fixedly connected to the two sub rotating mechanisms (not shown in the figure) in a one-to-one correspondence manner, the two sub rotating driving parts (not shown in the figure) drive the two sub rotating mechanisms to rotate, and then drive the first supporting mechanism 11 and the second supporting mechanism 12 to rotate along the 0 direction shown in the figure or the opposite direction thereof.

Under one control, after receiving electric signals, the motors of the two sub rotating driving parts drive the two sub rotating mechanisms to rotate along the 8 direction shown in the figure.

Under another control, after receiving the electric signals, the motors of the two sub rotating driving parts drive the two sub rotating mechanisms to rotate along the opposite direction of the θ direction shown in the figure.

Under another control, after receiving the electric signals, the motors of the two sub rotating driving parts drive any one of the two sub rotating mechanisms to rotate along the θ direction shown in the figure, and the other of the two sub rotating mechanisms to rotate along the opposite direction of the θ direction shown in the figure.

In the embodiment of the present invention, the translation adjusting mechanism comprises two sub translation adjusting mechanisms, the translation adjusting driving part comprises two sub translation adjusting driving parts, the two sub translation adjusting mechanisms are respectively movably arranged at the two sub translation adjusting driving parts along the translation direction, thus making the two sub translation adjusting mechanisms move respectively along the translation direction under the driving of the two sub translation adjusting driving parts.

Specifically, any one of the two sub translation adjusting driving parts comprises a linear motor and a translation guide rail 4; by taking one sub translation adjusting driving part and one sub translation adjusting mechanism as an example, the linear motor is movably arranged on the translation guide rail and is fixedly connected to one sub translation adjusting mechanism to drive the sub translation adjusting mechanism to move along a T direction shown in the figure or an opposite direction thereof; and the two sub translation adjusting mechanisms and the two sub translation adjusting driving parts are installed in the accommodating cavity 3.

Under one control, after receiving electric signals, the linear motors of the two sub translation adjusting driving parts all move along the T direction shown in the figure.

Under another control, after receiving the electric signals, the linear motors of the two sub translation adjusting driving parts all move along an opposite direction of the T direction shown in the figure.

Under another control, after receiving the electric signals, one of the linear motors of the two sub translation adjusting driving parts moves along the T direction shown in the figure, and the other of the linear motors moves along an opposite direction of the T direction shown in the figure.

In the embodiment of the present invention, the two sub rotating driving parts are respectively fixedly arranged at the two sub translation adjusting mechanisms to respectively control the two sub rotating mechanisms move along the translation direction under the driving of the two sub translation adjusting driving parts, thus driving the first supporting mechanism and the second supporting mechanism to move respectively along the translation direction.

Specifically, the two sub rotating driving parts are fixedly connected to the two sub translation adjusting mechanisms in a one-to-one correspondence manner, thus making the two sub translation adjusting driving parts drive the two sub rotating driving parts to move along the translation direction, i.e., move along the T direction shown in the figure or the opposite direction thereof, and then driving the first supporting mechanism 11 and the second supporting mechanism 12 to move along the T direction shown in FIG. 4 or the opposite direction thereof (which is interpreted to mean the wafer transfer device occupies unfolded spaces).

In the embodiment of the present invention, the lifting mechanism comprises two sub lifting mechanisms, the lifting driving part comprises two sub lifting driving parts, the two sub lifting mechanisms are respectively movably arranged at the two sub lifting driving parts along the lifting direction, thus making the two sub lifting mechanisms move respectively along the lifting direction under the driving of the two sub lifting driving parts.

Specifically, any one of the two sub lifting adjusting driving parts comprises a linear motor and a lifting guide rail 5; by taking one sub lifting driving part and one sub lifting mechanism as an example, the linear motor is movably arranged on the lifting guide rail 5 and is fixedly connected to one sub lifting mechanism, thus driving the sub lifting mechanism to move along the Z direction shown in the figure or the opposite direction thereof.

Under one control, after receiving electric signals, the linear motors of the two sub lifting driving parts move along the Z direction shown in the figure.

Under another control, after receiving the electric signals, the linear motors of the two sub lifting driving parts move along the opposite direction of the Z direction shown in the figure.

Under another control, after receiving the electric signals, any one of the linear motors of the two sub lifting driving parts moves along the Z direction shown in the figure, and the other of the linear motors moves along the opposite direction of the Z direction shown in the figure.

In the embodiment of the present invention, the two sub translation adjusting driving parts are respectively fixedly arranged at the two sub lifting mechanisms to respectively control the two sub translation adjusting mechanisms to move along the lifting direction under the driving of the two sub lifting driving parts, thus driving the first supporting mechanism and the second supporting mechanisms to move respectively along the lifting direction.

Specifically, referring to FIG. 1, the two sub translation adjusting driving parts (not shown in the figure) are fixedly connected to the two sub lifting mechanisms (not shown in the figure) in a one-to-one correspondence manner, the two sub lifting driving parts (not shown in the figure) drive the two sub translation adjusting driving parts to move along the lifting direction, i.e., move along the Z direction shown in the figure or the opposite direction thereof, and then drives the first supporting mechanism 11 and the second supporting mechanism 12 to move respectively along the Z direction shown in the figure or the opposite direction thereof.

To solve the problem in the prior art, the embodiment of the present invention provides a wafer transfer method.

In the embodiment of the present invention, the wafer transfer method comprises driving, by the rotating driving part, the rotating mechanism to rotate, and then driving at least one of the first supporting mechanism and the second supporting mechanism to rotate synchronously, thus making the first picking-conveying mechanism and the second picking-conveying mechanism face a wafer picking position or a wafer placement position; driving the first picking-conveying mechanism and the second picking-conveying mechanism by the picking-conveying driving part, thus making the first picking-conveying mechanism and the second picking-conveying mechanism stretch out along arrangement directions of picking-conveying guide structures, and making the tail end execution part of the first picking-conveying mechanism and the tail end execution part of the second picking-conveying mechanism achieve the action of gripping or placement, and retracting after completing the action.

Specifically, the rotating mechanism is driven by the rotating driving part to rotate to drive at least one of the first supporting mechanism 11 and the second supporting mechanism 12 to rotate synchronously, thus making the first picking-conveying mechanism 22 and the second picking-conveying mechanism 23 face the wafer gripping position or the wafer placement position; the picking-conveying driving part drives the first picking-conveying mechanism 22 and the second picking-conveying mechanism 23 to make the first picking-conveying mechanism 22 and the second picking-conveying mechanism 23 stretch out along arrangement directions of the picking-conveying guide structures; the gripping or placement action is achieved through the tail end execution part of the first picking-conveying mechanism and the tail end execution part of the second picking-conveying mechanism, and the first picking-conveying mechanism and the second picking-conveying mechanism retract after the action is completed.

While the embodiments of the present invention have been described in detail, it will be apparent to those skilled in the art that various modifications and changes can be made to the embodiments. However, it should be understood that such modifications and variations are within the scope and spirit of the present invention as described in the appended claims. Furthermore, the present invention described herein is susceptible to other embodiments and may be embodied or carried out in various ways.

What is claimed is:

1. A wafer transfer device comprising:
a first supporting mechanism and a second supporting mechanism, wherein the first supporting mechanism and the second supporting mechanisms are arranged side by side along a first axis direction from a front wall of the first supporting mechanism towards a back wall of the second supporting mechanism, each of the first supporting mechanism and the second supporting mechanism being of a hollow box where a first or second picking-conveying driving part is accommodated therein, wherein the first supporting mechanism and the second supporting mechanism each is configured to extend along a second axis direction perpendicular to the first axis direction;
wherein the front wall of the first supporting mechanism and the back wall of the second supporting mechanism are each provided with a picking-conveying guide rail configured to extend along the second axis direction of the first supporting mechanism and the second supporting mechanism;
a first picking-conveying mechanism and a second picking-conveying mechanism movably arranged at the picking-conveying guide rail of the first supporting mechanism and the picking-conveying guide rail of the second supporting mechanism respectively;
wherein the first picking-conveying mechanism and the second picking-conveying mechanism each comprise a tail end execution part, the tail end execution part of the first picking-conveying mechanism and the tail end execution part of the second picking-conveying mechanism are overlapped along a third axis direction with a gap therebetween to prevent collision and adapted to pick and convey wafers at opposite lateral walls of the first supporting mechanism and the second supporting mechanism, wherein the third axis direction is perpendicular to a plane defined by the first axis direction and the second axis direction;
wherein the first and second picking-conveying driving parts are coupled to the first picking-conveying mechanism and the second picking-conveying mechanism respectively; and
wherein the wafer transfer device further comprises a second-axis-direction adjusting mechanism and a second-axis-direction driving part, and the second-axis-direction adjusting mechanism is movably arranged at the second-axis-direction driving part along the second axis direction;
a rotating mechanism and a rotating driving part, wherein the rotating mechanism is disposed adjacent a bottom wall of the first supporting mechanism and the second supporting mechanism, the first supporting mechanism and the second supporting mechanism are fixedly arranged at the rotating mechanism, the rotating mechanism is rotatably arranged on the rotating driving part, and the rotating driving part is configured to drives the rotating mechanism to rotate so as to drive at least one of the first supporting mechanism and the second supporting mechanism to rotate or both of the first supporting mechanism and the second supporting mechanism to rotate synchronously, thus changing a movement direction of at least one of the first picking-conveying mechanism and the second picking-conveying mechanism;
the rotating driving part is fixedly arranged at the second-axis-direction adjusting mechanism, the second-axis-direction driving part drives the second-axis-direction adjusting mechanism to move along the second axis direction, and then drives the rotating driving part and the rotating mechanism to move along the second axis direction, thus making at least one of the first supporting mechanism and the second supporting mechanism move along the second axis direction;
wherein the wafer transfer device is configured to occupy a folded space when the first supporting mechanism and the second supporting mechanism are kept to be arranged side by side along the first axis direction and is to selectively occupy a plurality of different unfolded spaces when one or both of the first supporting mechanism and the second supporting mechanism are driven to move along the second axis direction or rotate so as to enable the tail end execution part of the first picking-conveying mechanism and the tail end execution part of the second picking-conveying mechanism to reach different locations at opposite lateral walls of the first supporting mechanism and the second supporting mechanism.

2. The wafer transfer device according to claim 1, wherein the device further comprises a third-axis-direction lifting mechanism and a third-axis-direction driving part, and the third-axis-direction lifting mechanism is movably arranged at the third-axis-direction driving part along the third axis direction;
the second-axis-direction driving part is fixedly arranged to the third-axis-direction lifting mechanism, the third-axis-direction driving part drives the third-axis-direction lifting mechanism to move along the third-axis direction, and then drives the second-axis-direction driving part and the second-axis-direction adjusting mechanism to move along the third-axis direction, thus making at least one of the first supporting mechanism and the second supporting mechanism move along the third-axis direction.

3. A wafer transfer method of the wafer transfer device according to claim 1, the method comprising:
driving, by the rotating driving part, the rotating mechanism to rotate, and then driving at least one of the first supporting mechanism and the second supporting mechanism to rotate synchronously, thus making the first picking-conveying mechanism and the second picking-conveying mechanism face a wafer picking position or a wafer placement position; and
driving the first picking-conveying mechanism and the second picking-conveying mechanism by the picking-conveying driving part, thus making the first picking-conveying mechanism and the second picking-conveying mechanism stretch out along arrangement directions of picking-conveying guide structures, and making the tail end execution part of the first picking-conveying mechanism and the tail end execution part of the second picking-conveying mechanism pick and convey a wafer.

* * * * *